United States Patent [19]
Tanaka et al.

[11] Patent Number: 6,118,334
[45] Date of Patent: Sep. 12, 2000

[54] SEMICONDUCTOR INTEGRATED CIRCUIT AND POWER SUPPLY ROUTING METHOD AND SYSTEM

[75] Inventors: Hiroshi Tanaka; Masami Murakata, both of Tokyo, Japan

[73] Assignee: Kabushiki Kaisha Toshiba, Kawasaki, Japan

[21] Appl. No.: 09/084,117

[22] Filed: May 26, 1998

[30] Foreign Application Priority Data

May 19, 1997 [JP] Japan .................................. 9-135588

[51] Int. Cl.[7] .................................................. H01L 25/00
[52] U.S. Cl. ............................................ 327/565; 361/601
[58] Field of Search ................................ 327/564, 565; 361/601, 748, 777, 760

[56] References Cited

U.S. PATENT DOCUMENTS

| | | | |
|---|---|---|---|
| 5,521,541 | 5/1996 | Okamura | 327/565 |
| 5,663,677 | 9/1997 | Freyman et al. | 327/565 |
| 5,796,299 | 8/1998 | Sei et al. | 327/564 |

*Primary Examiner*—Jung Ho Kim
*Attorney, Agent, or Firm*—Foley & Lardner

[57] ABSTRACT

An improved semiconductor integrated circuit and power supply wiring designing method and system is described in which the wiring resources have been effectively used without oppressing the same. The semiconductor integrated circuit in accordance with the present invention comprising: a semiconductor chip; an integrated circuit formed within the semiconductor chip; a first power supply pad; a first power supply wiring having a cyclic pattern formed on the integrated circuit for the purpose of supplying power to the integrated circuit from the first the power supply pad; a second power supply pad; and a second power supply wiring having an acyclic pattern formed on the integrated circuit for the purpose of supplying supplementary power to the integrated circuit from the second power supply pad. Particularly the second power supply wiring is connected to the second power supply pad in a binary tree fashion in order to maintain a voltage drop under a required level of each region of the integrated circuit as defined by the first power supply wiring.

8 Claims, 11 Drawing Sheets

SEMICONDUCTOR INTEGRATED CIRCUIT AND POWER SUPPLY ROUTING METHOD AND SYSTEM

BACKGROUND OF THE INVENTION

1. Field of the Invention

The present invention is related to a semiconductor integrated circuit device of ASICs etc., and a power supply routing method and system for improving the layout of wiring configuration.

2. Prior Art

As power supply wiring structures of conventional integrated circuits, 3 kinds are generally known, i.e., (1) structures with varied widths of wiring, (2) structures with power supply auxiliary wiring that electrically reinforces the main power supply wiring, (3) structures with the ring-shaped power supply main wiring within which optional form power supply auxiliary wiring.

FIG. 1 is a schematic diagram showing the example of a power supply wiring structure of the above (1) that was disclosed in Japanese Published Application No.Hei2-188, 943. In the same figure, the reference numeral 100a~100f are function blocks of a LSI chip and the reference numeral 101,102 is a first layer power supply wiring. Also, the reference numeral 103 is a second layer power supply wiring and the reference numeral 104 is a power supply pad.

The design method of the power supply wiring is conducted first by calculating consumption of electric power within each of the function blocks, which are spatially defined by the power supply wiring to be provided. Then, the wiring width of the power supply wiring is determined on the basis of the calculation result of the electric power consumption.

The effective average electric current supplied to each of the function blocks is calculated, on the assumption that the current is passed from the power supply pad 104 through the first layer power supply wiring 101,102 and a via 105 in the example, and therefore the wiring widths of the second layer power supply wiring 103a, 103b are 2 times wider than others.

FIG. 2 shows the examples of the power supply wiring structure of the above (2) that was shown in Japanese Published Application No.Hei2-187,050. In the same figure, the reference numerals 201,202 are power supply wirings, 203,204 are power supply auxiliary wirings, and 205 is a basic cell composed of a plural transistor. The power supply auxiliary wiring 208 is arranged in the column direction for each m cells of the basic cell 205 while the power supply auxiliary wiring 204 is arranged in the line direction for each m cells of the basic cell 205. The arrangement process of this power supply auxiliary wiring 203,204 determines with the wiring width and the wiring interval in order to optimally control the electric current density inside the area as defined by the power supply auxiliary wiring 203,204.

FIG. 3 is the figure that shows the examples of the power supply wiring structure of the above (3) that was shown in Japanese Published Application No.Hei4-107,845. In the same figure, the reference numeral 301 is a function block, the reference numeral 302 is an electric current source, the reference numeral 803 is the ring-shaped power supply wiring and also 304 is a power supply pad. An optional form power supply wiring is connected to the ring-shaped power supply wiring 303 within each function block 201. Electric power is supplied to the electric current source 302 through the power supply wiring inside the ring-shaped power supply wiring 303 and also the function block 301 from the power supply pad 304.

However, there are the following problems in the above conventional power supply wiring structure. While electric power (electric current) consumption increases with a larger scale integration, conventional structures such as those composed only with usual power supply wiring e.g., ring-shaped power supply wiring with the varied wiring width of (1) mentioned above and the structure that established optional form power supply wiring inside of the basic ring-shaped power supply wiring tend to result in a wrong action originating from fluctuation of the power supply voltage due to voltage drop and poor performance which can not satisfy the required specification.

In the case of the structure having the power supply auxiliary wiring that electrically reinforces main power supply wiring in which voltage drop is mitigated by the power supply auxiliary wiring, there is the possibility that the sufficient voltage is not obtained because wiring width and wiring interval etc. are calculated based upon the consumption electric power inside only the small area as divided, without considering that electric current flows to the areas which are out of consideration when the power supply auxiliary wiring is designed. Furthermore there are many wastes in the wiring resources, because the power supply auxiliary wiring is arranged in many areas where the voltage drop is not so large as to require the power supply auxiliary wiring.

SUMMARY OF THE INVENTION

It is an object of the present invention to provide an improved semiconductor integrated circuit and power supply routing method and system in which the wiring resources have been effectively used without oppressing the same and by which a sufficient voltage can be supplied to all cells.

It is another object of the present invention to provide an improved semiconductor integrated circuit and power supply routing method and system by which an appropriate and effective design of the power supply auxiliary wiring can be more accurately determined.

In order to achieve (or accomplish/attain) the above-mentioned objects, in accordance with the present invention, a semiconductor integrated circuit comprising a semiconductor chip; an integrated circuit formed within the semiconductor chip; a first power supply pad; a first power supply wiring having a cyclic pattern formed on said integrated circuit for the purpose of supplying power to said integrated circuit from the first said power supply pad; a second power supply pad; and a second power supply wiring having an acyclic pattern formed on said integrated circuit for the purpose of supplementing power to said integrated circuit from said second power supply pad; wherein said second power supply wiring is connected to said second power supply pad in a binary tree fashion in order to maintain a voltage drop under a required level of each region of said integrated circuit as defined by said first power supply wiring.

Accordingly, the wiring resources have been effectively used without oppressing the wiring resources to the semiconductor chip supply the necessary and sufficient power throughout the operatable circuit portions because the power supply auxiliary wiring is coupled to the power supply wiring in the form of a binary tree, and therefore it is possible to obviate a wrong action originating from fluctuation of the power supply voltage due to voltage drop and deterioration of the performance.

In a preferred embodiment, said first power supply wiring is provided in a grid form.

In accordance with another aspect of the present invention, a method of designing power supply wiring on a semiconductor integrated circuit formed within a semiconductor chip comprising: a grid state power supply wiring layout determination process for determining the line width and the intervals of a grid form power supply wiring for supplying electric power to integrated circuits in accordance with the internal structure of said integrated circuits; an electric current consumption calculation process for calculating power consumption within each region of said integrated circuit as defined by said grid state power supply wiring; an electric current/voltage calculation process for calculating an average voltage and an electric current of each side of a square as part of said grid state first power supply wiring in accordance with the calculation results of said electric current consumption calculation process; a power supply auxiliary wiring layout determination process for obtaining restriction conditions of supplementary currents and supplementary voltage drops applicable respectively to said sides in accordance with the calculation results of said electric current/voltage calculation process and designing a power supply auxiliary wiring in the form of a binary tree which satisfies said restriction conditions and connected to a power supply pad, to which said power supply wiring is not connected.

Accordingly, an appropriate and effective design of the power supply auxiliary wiring can be more accurately determined because the branch flow of the electric current into the power supply auxiliary wiring in the form of a binary tree is correctly: considered and different power supply pads are used for the power supply wiring and power supply auxiliary wiring, respectively.

In a preferred embodiment, said restriction conditions of supplementary currents and supplementary voltage drops are obtained in accordance with the following equation in said power supply auxiliary wiring layout determination process, $$(Isupij, Vsupij) = (Iij(1 - Vmax/dVij), Vmax)$$

where Isupij and Vsupij are a supplementary electric currents and the supplementary voltage drop required at a power supply grid element (i, j) of said power supply wiring corresponding to one of said sides, Iij is an electric current value flowing to the power supply grid element (i, j) of said power supply wiring corresponding to one of said sides, Vmax is a maximum allowable voltage drop from the power supply pad to the power supply grid elements, and dVij is a voltage drop from the power supply pad to the power supply grid element (i, j).

In a preferred embodiment, said power supply auxiliary wiring layout determination process comprises; a power supply grid element selection process for selecting a predetermined number of the power supply grid elements having larger supplementary electric current values than the rest of said grid element among from the supplementary electric current values of the restriction condition; a power supply grid element clustering process for clustering those of the selected power supply grid elements as selected by said power supply grid element selection process, respectively for each power supply auxiliary pad, considering the distribution of the restriction conditions of the power supply auxiliary wiring and the location of said power supply pad: a power supply grid element pairing process for paring the clustered power supply grid elements, taking into consideration the supplementary electric current value, the supplementary voltage drop and the location of the respective clustered power supply grid elements; a power supply grid branch point calculation process for obtaining location of a branch point on a path connecting each pair of the clustered power supply grid elements in order that the equation is satisfied, and assigning a corresponding restriction condition to each branch point; a power supply auxiliary pad connection process for connecting a single branch point for each cluster to the corresponding power supply pad, with wirings having such a width as to satisfy the restriction condition such that the supplementary current and the supplementary voltage drop are satisfied, in order to complete designing a power supper auxiliary wiring in the form of a binary tree.

In a preferred embodiment, the restriction conditions (I, V) of the supplementary current and the supplementary voltage drop as used in said power supply grid branch point calculation process are obtained in accordance with the following equation.

$$(I, V) = (I1 + I2, (I2V2 + I2V1 - R1I1I2)/(I1 + I2))$$

In accordance with a further aspect of the present invention, a method of designing power supply wiring for integrated circuits formed within a semiconductor chip comprising: a grid state power supply wiring layout determination process for determining the line width and the intervals of a grid state power supply wiring connected to a power supply pad for supplying electric power to said integrated circuits in accordance with the internal structure of said integrated circuits; an electric current consumption calculation process for calculating power consumption within each of a plurality of regions of said integrated circuit as defined by said grid state power supply wiring; an electric current/voltage calculation process for calculating an average voltage at and an electric current passing through each of power supply grid elements of said grid state power supply wiring as located between of each adjacent grid points in accordance with the calculation results of said electric current consumption calculation process; a power supply auxiliary wiring layout determination process for obtaining restriction conditions of resistance values of the power supply auxiliary wiring applicable respectively to said power supply grid elements of said grid state power supply wiring and designing a power supply auxiliary wiring in the form of a binary tree which satisfies said restriction conditions in accordance with the calculation results of said electric current/voltage calculation process and connected to a power supply auxiliary pad, to which said power supply wiring is not connected.

In a preferred embodiment, said restriction conditions to the supplementary resistances are obtained in accordance with the following equation in said power supply auxiliary wiring layout determination process, $$Resupij \geq Rij \cdot Rmaxij/(Rij - Rmaxij)$$

wherein Rsupij is the supplementary resistance value necessary for the power supply auxiliary wiring to the power supply grid element (i,j); Rij is the effective resistance value of the corresponding part of the grid form power supply wiring extending to the power supply grid element (i, j) from the power supply pad; Rmaxij is the maximum allowable resistance value from the power supply pad to the power supply grid element (i, j).

In a preferred embodiment said power supply auxiliary wiring layout determination process comprises a power supply grid element selection process for selecting a predetermined number of said power supply grid elements of said grid state power supply wiring having larger supplementary resistance values than the rest of said power supply grid elements among from the supplementary resistance values of the restriction condition; a power supply grid element clustering process for clustering those of the selected power supply grid elements as selected by said power supply grid element selection process, respectively for each power supply auxiliary pad, considering the distribution of the restriction conditions of the resistance values of said power supply auxiliary wiring and the location of said power supply auxiliary pad; a power supply grid element pairing process for paring the clustered power supply grid elements, taking into consideration the supplementary resistance values, and the location of the respective clustered power supply grid elements, a power supply grid branch point calculation process for obtaining location of a branch point on a path connecting each pair of the clustered power supply grid elements in order that the equation is satisfied, and thereafter assigning a corresponding restriction condition to each branch point; a power supply auxiliary pad connection process for connecting a single branch point for each cluster to the corresponding power supply pad, with wirings having such a width as to satisfy the restriction condition such that the supplementary resistance values are satisfied, in order to complete designing a power supply auxiliary wiring in the form of a binary tree.

In accordance with a further aspect of the present invention, a computer program embodied on a computer-readable medium for designing power supply wiring for integrated circuits formed within a semiconductor chip comprising, said program comprising: means for setting a preset value of at least one manufacturing process factor with influence exerting upon a physical value of a substance as formed in said manufacturing apparatus; means for determining the line width and the interval of a grid state power supply wiring connected to a power supply pad for supplying electric power to said integrated circuits in accordance with the internal structure of said integrated circuits; means for calculating power consumption within each of a plurality of regions of said integrated circuit as defined by said grid state power supply wiring; means for calculating an average voltage at and an electric current passing through each of power supply grid elements of said grid state power supply wiring as located between of each adjacent grid points in accordance with the calculation results of said electric current consumption calculation process; means for obtaining restriction conditions of supplementary currents and supplementary voltage drops applicable respectively to said sides and designing a power supply auxiliary wiring in the form of a binary tree which satisfies said restriction conditions in accordance with the calculation results of said electric current/voltage calculation process and connected to a power supply auxiliary pad, to which said power supply wiring is not connected.

BRIEF DESCRIPTION OF DRAWINGS

The aforementioned and other features and objects of the present invention and the mariner of attaining them will become more apparent and the invention itself will be best understood by reference to the following description of a preferred embodiment taken in conjunction with the accompanying drawings, wherein:

FIGS. 10(a)~10(e) are schematic diagrams for explaining the power supply auxiliary wiring layout determination process.

DETAILED DESCRIPTION OF EMBODIMENTS

Figure 1:
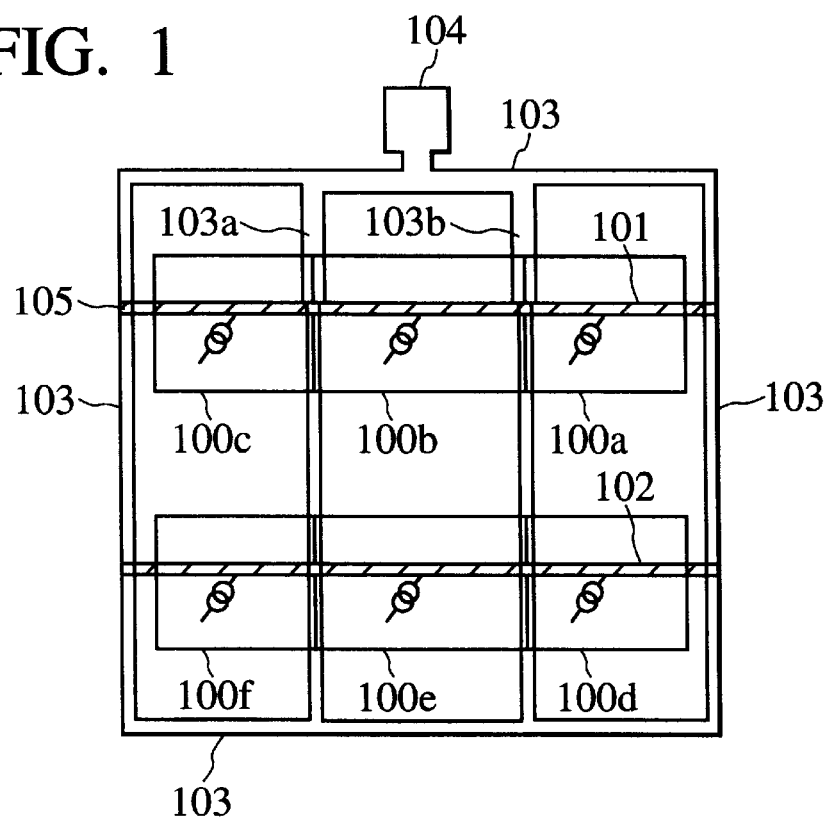
FIG. 1 is a schematic diagram showing a conventional power supply wiring structure.
Figure 2:
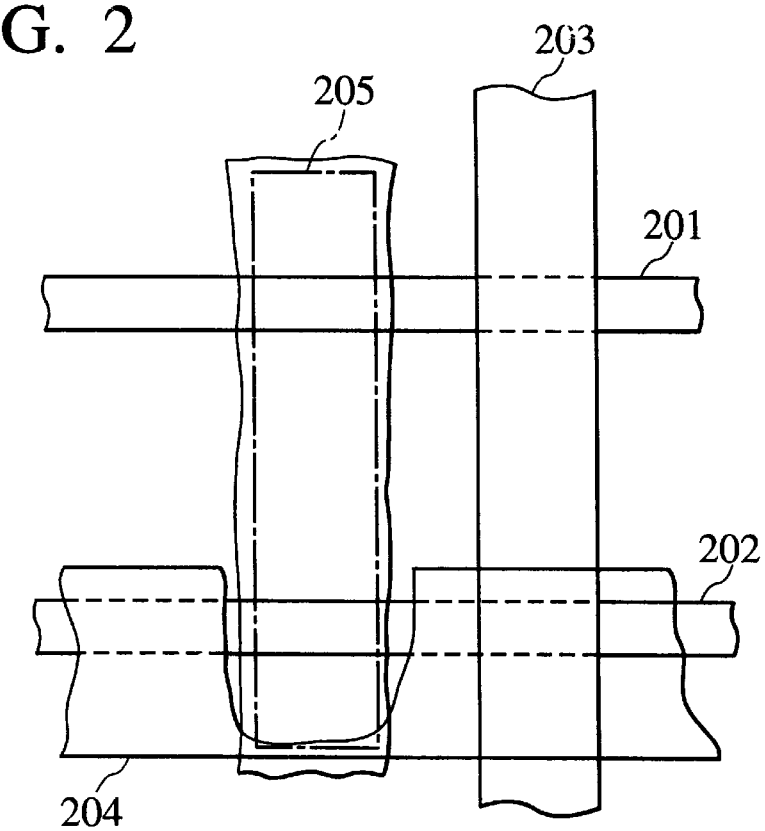
FIG. 2 is a schematic partial view showing a conventional power supply wiring structure.
Figure 3:
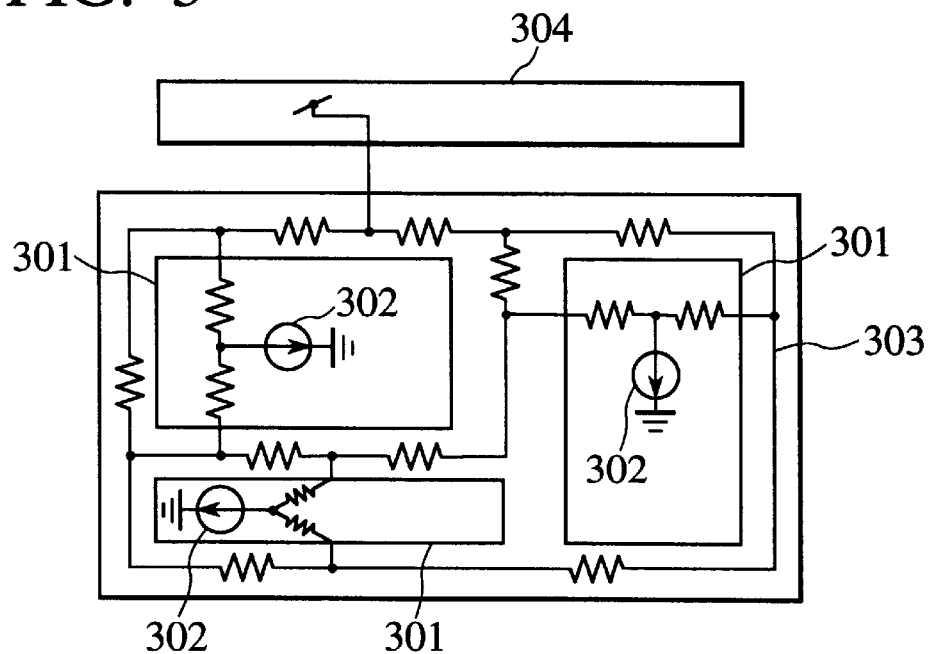
FIG. 3 is a circuit diagram showing a conventional power supply wiring structure.
Figure 4:
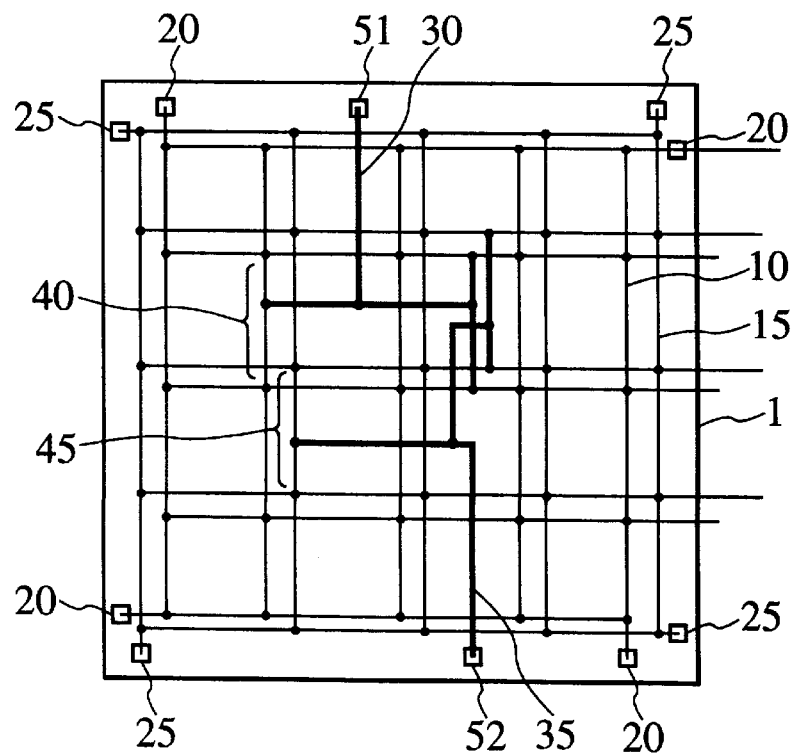
FIG. 4 is a schematic view showing the power supply wiring structure of the semiconductor integrated circuit device in accordance with a first embodiment.

Hereinbelow, a first embodiment in accordance with the present invention will be explained in conjunction with the accompanied drawings. FIG. 4 is a schematic view showing the power supply wiring structure of a semiconductor integrated circuit device in accordance with the first embodiment.

A grid form power supply wiring 10 and grid form ground wiring 15 are formed on a semiconductor chip 1 in order to supply electric power to integrated circuits implementing required functions and fabricated within the semiconductor chip 1. While the grid form power supply wiring 10 is connected to a power supply pad 20, as shown in the same figure, the grid form ground wiring 15 is connected to a ground pad 25. Furthermore, a power supply auxiliary wiring 80 and a ground auxiliary wiring 35 are provided, to reinforce the power supply wiring 10 and also the ground wiring 15 electrically.

The power supply auxiliary wiring 30 is connected to a power supply pad 51, separated from the power supply pad 20 connected to the grid form power supply wiring 10, and also connected to the power supply grid element 40 (parts of the wiring forming one of the four sides of the respective open square of the grid as partitioned) in the form of a binary tree.

The ground auxiliary wiring 35 is connected to the ground pad 52, separated from the ground pad 25 connected to the grid form ground wiring 15, and also connected to the ground element 45 in the form of a binary tree. Like this, the power supply auxiliary wiring 30 and also the ground auxiliary wiring 35 of this first embodiment is supplied with electric current from power supply pad 51,52, separated from the power supply pad 20,25 connected to the grid form ground wiring 15 and the grid form power supply wiring 10. And, the power supply auxiliary wiring 30 and also the ground auxiliary wiring 35 of this enforcement structure are connected to power supply grid element 40,45 in the form of a binary tree in order that voltage drop inside each area of the integrated circuit partitioned by the power supply wiring 10 and the ground wiring 15 is limited not to exert the influence upon the circuit action.

Furthermore, while the width of the power supply auxiliary wiring 30 and also the ground auxiliary wiring 35 are even in the same figure, variation in the width may be effective depending upon the practice. Also, this example is simply applicable to a plurality of pairs of grid form power supply wirings and grid form power supply wirings as reinforced with power supply auxiliary wirings and ground auxiliary wirings, although it is shown with the power supply wiring having a single pair of such grid form power supply wirings.

Also, typically, the grid form power supply wiring 10 and the grid form ground wiring 15 and the power supply auxiliary wiring 30 and the ground auxiliary wiring 35 are provided with multi-layer aluminum wiring. To avoid the interference between the respective wirings, the wiring in the column direction and the wiring in the line direction are formed to different layers. Furthermore, when the grid form power supply wiring 10 and the grid form ground wiring 15 and the power supply auxiliary wiring 30 are located in different layers, the interference among wirings can be more effectively avoided.

For example, the grid form power supply wiring 10 and the grid form ground wiring 15 are formed in the first layer and the second layer while the power supply auxiliary wiring 30 and the ground auxiliary wiring 35 are formed in the 3rd layer and the 4th layer. However, in the case that there are few available wiring layers, the grid form power supply wiring 10 and the grid form ground wiring 15 are formed in the first layer and the second layer while the power supply auxiliary wiring 30 and the ground auxiliary wiring 36 are formed in the second layer and the 3rd layer, or in the first layer and the second layer in the same manner as the grid form power supply wiring 10 and the grid form ground wiring 15.

Conversely, in the case that there are many available wiring layers, the grid form power supply wiring 10 and the grid form ground wiring 15 are formed in the first layer and the second layer while the power supply auxiliary wiring 30 and the ground auxiliary wiring 35 are formed in the 3rd layer and the 4th layer and in addition to these, also in the 5th or 6th or upper layer. Generally speaking, flexibility in design is enhanced in upper layers with wider wirings.

Figure 5:
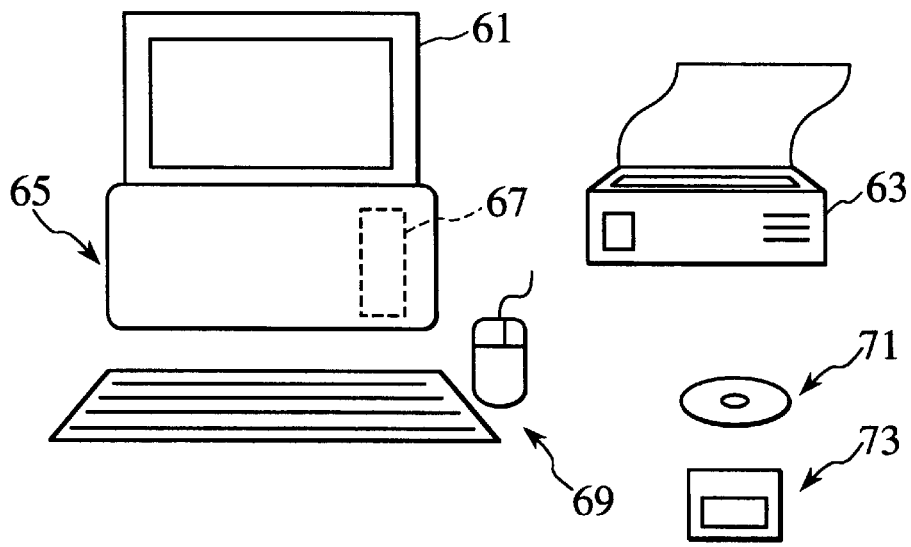
FIG. 5 is a schematic view showing the hardware configuration of the designing system of the power supply wiring in accordance with the present invention.

The hardware configuration of the designing system of the power supply wiring in accordance with the present invention is shown in FIG. 5. Namely, the system includes a computer 65 for implementing the processes of the respective steps as explained below, internal storage means 67 such as a hard disk device, input means 69 such as a mouse and a keyboard, output means such as a monitor 61 and a printer 63, and an external storage medium and disk drive such as a CD-ROM 71 and a flexible disk 73. Executable program codes are stored in the external storage medium and loaded to a main memory provided in the computer for actually running the program corresponding to the respective processes as explained here. The system may be provided with a usually and widely available and commercially distributed computer system. Furthermore, the MPU is provided with an operation unit for execution of required commands and a main memory for storing a program for the respective steps.

Next, the design method of the power supply wiring in the first embodiment will be explained in reference to the flowchart of FIG. 6. Furthermore, the explanation of the ground wiring 15 and the ground auxiliary wiring 35 will be dispensed with, for the purpose of making clear the explanation.

Figure 6:
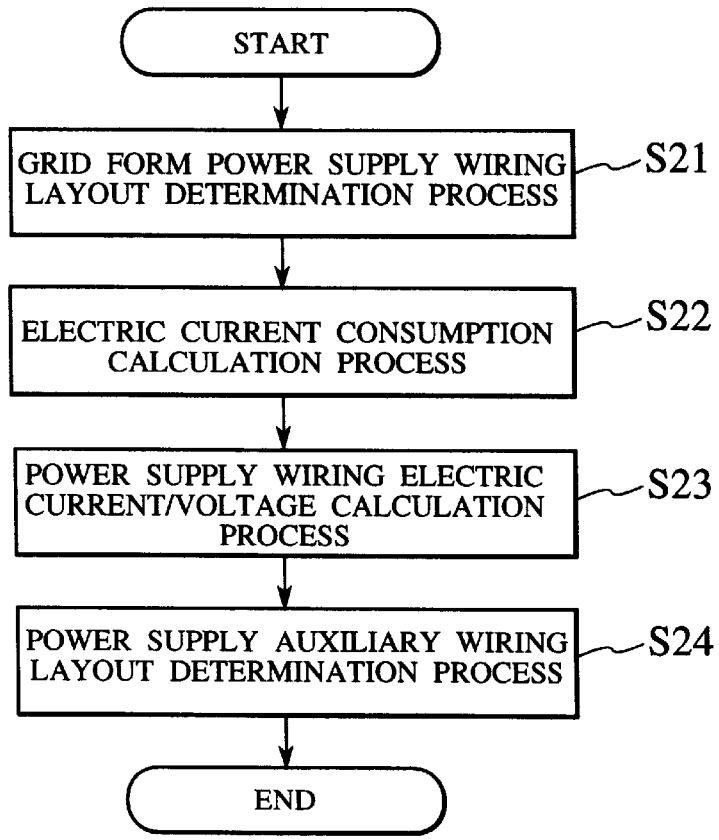
FIG. 6 is a flowchart showing the designing method in accordance with the first embodiment.

As shown in FIG. 6, the design method of the power supply wiring in this embodiment is composed of a grid form power supply wiring layout determination process (step S21), an electric current consumption calculation process (step S22), a power supply wiring electric current/voltage calculation process (step 823) and a power supply auxiliary wiring layout determination process (step S24).

In the grid form power supply wiring layout determination process (step S21), the wiring width and wiring interval of the grid form power supply wiring 10 are calculated from the chip size, operating frequency, power supply voltage and also placement of the constituent transistors to determine the layout of the grid form power supply wiring by the use of the theoretical equation and empirical equation and so forth prepared in advance.

In the electric current consumption calculation process (step S22), the average electric current (power) consumed inside of each area partitioned by the grid form power supply wiring 10 is calculated from the power supply voltage, operating frequency, circuit load and switching probability as estimated from simulation and so forth. Because the power supply electric current proportions to the product of the operating frequency, the power supply voltage, circuit load and average switching probability in the case of CMOS circuits, the electric current consumption inside each area can be obtained easily.

Figure 7:
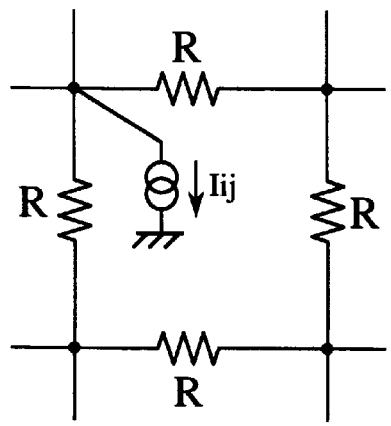
FIG. 7 is an equivalent circuit diagram of a grid form power supply wiring.

In the power supply wiring electric current/voltage calculation process (step S23), the electric current/voltage value in each power supply grid element is calculated by simulating an equivalent circuit of the grid form power supply wiring 10 from the electric current consumption obtained step S22 as shown in FIG. 7. In the power supply auxiliary wiring layout determination process (step S24), restriction conditions regarding the resistance value of the power supply auxiliary wiring needed for each power supply grid element 40 are obtained on the basis of the following equation (1) in order to determine such binary tree form power supply auxiliary wiring 30 as satisfying the restriction conditions $$Rsupij \leq Rij \cdot Rmaxij/(Rij - Rmaxij) \tag{1}$$

In the equation (1), $Rsupij$ is the supplementary resistance value necessary for the power supply auxiliary wiring 30 to the power supply grid element (i,j); $Rij$ is the effective resistance value of the corresponding part of the grid form power supply wiring (or the grid form power supply auxiliary wiring) extending to the power supply grid element (i, j) from the power supply pad 20; $Rmaxij$ is the maximum allowable resistance value from the power supply pad 20 to the power supply grid element (i, j).

All effective resistance value from the power supply pad 20 to the power supply grid element (i, j) can be provided not to exceed maximum allowable resistance value resulting in the voltage drop within the allowable range by connecting the power supply auxiliary wiring 30 having the resistance value Rsupij as in the equation (1) to the power supply wiring 10 in parallel to the route thereof from the power supply pad 20 to the power supply grid element (i, j).

Figure 8A:
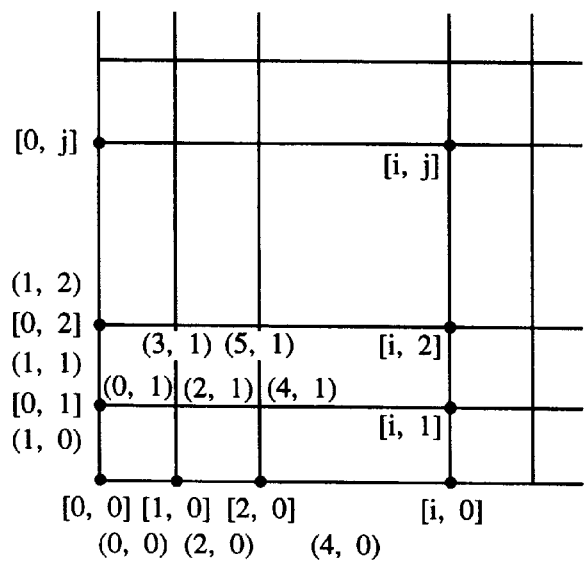
FIGS. 8(a), 8(b) are schematic diagrams for explaining grids and grid points [i, j].
Figure 8B:
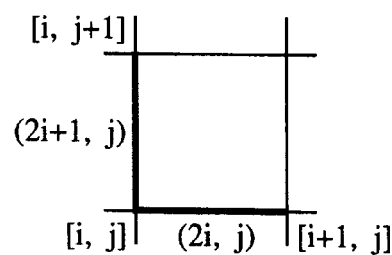

Each value of the equation (1) can be obtained in the following manner. When the respective grid points of the power supply wiring are labeled with [i, j] toward the right top from the left bottom as shown in FIG. 8(a), the power supply grid element connecting the grid point [i+1,j] and the grid point [i,j] are labeled with (2i, j), and the power supply grid element connecting the grid point [i,j+1] and the grid point [i,j] are labeled with (2i+1, j) in the same manner.

Effective resistance Rij from the power supply pad 20 to the power supply grid element (i, j) is obtained as the value ((V−Vij)/Iij) calculated by dividing the difference in voltage Vij (voltage drop through the power supply wiring) between the power supply voltage V and the effective voltage V(i, j) at power supply grid element by the electric current Iij flowing there. The maximum allowable resistance Remaxij to the power supply grid element (i, j) is obtained as the value ((Vmax)/Iij) calculated by dividing the maximum allowable Vmax the power supply by the electric current Iij flowing there.

Next, with reference to the flowchart of FIG. 9, the power supply auxiliary wiring layout determination process that mentioned above will be explained. In the power supply grid element selection process (step S31), a predetermined number of the power supply grid elements are selected which have larger supplementary resistance values than the rest among from the supplementary resistance values of the restriction condition as obtained. In the power supply grid element clustering process (step S32), for each power supply auxiliary pad, those of the selected power supply grid elements as connected to said each power supply auxiliary pad through power supply auxiliary wiring are clustered respectively. Namely, considering the distribution of resistance value Rsupij of power supply auxiliary wiring 30 respective to the power supply grid elements, the power supply grid elements are clustered with respect to each pouter supply pad 51 by selecting from nearer ones to that pad in order. In the power supply grid element pairing process (step S33), each adjacent two of the clustered power supply grid elements are paired, taking into consideration the respective resistance values and the respective positions of power supply auxiliary wiring 30.

In the power supply grid branch point calculation process (step S34), a branch point (first level branch point) is located on a path connecting each pair of the clustered power supply grid elements in order that the resistance value between one of a pair and the branch point is equal to the resistance value between other of a pair and the branch point or that the above equation (1) is satisfied. After determining the locations of the first level branch points of all the pairs of the clustered power supply grid elements, the branch points are then treated as those corresponding to the power supply grid elements and paired in the same manner followed by locating a second level branch point located on a path connecting each pair of the first level branch points, in order that the above equation (1) is satisfied. This procedure is repeated until each cluster of the power supply grid elements has a single branch point (step S35), which is finally connected to the corresponding power supply pad in a power supply auxiliary pad connection process (step S36), with wirings having such a width as to satisfy the respective resistance value Rsupij to complete the formation of the power supply auxiliary wiring 30 in a tree structure (binary tree).

Figure 10A:
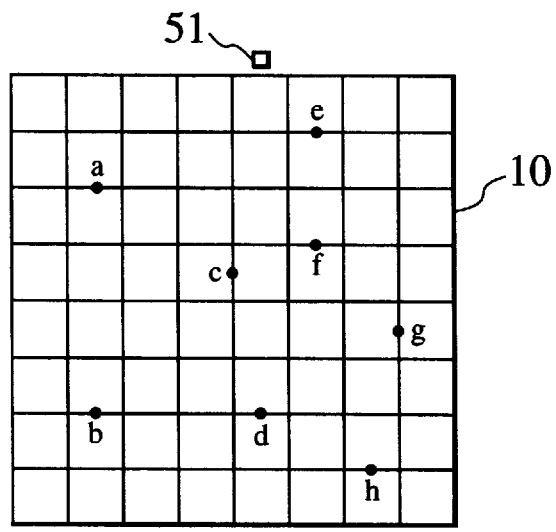
Figure 10B:
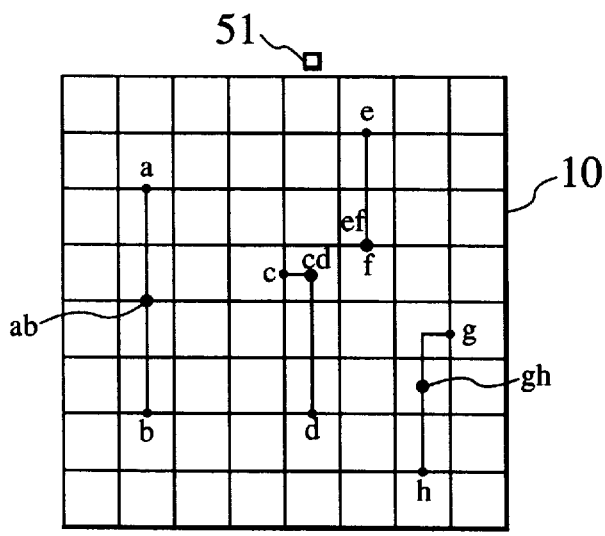
Figure 10C:
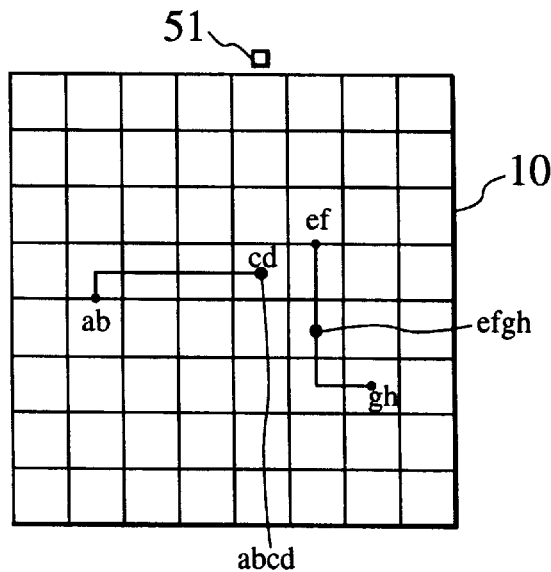

Next, with reference to FIGS. 10(a)~10(c) and also FIGS. 11(d), 11(e), the above power supply auxiliary wiring layout determination process will be explained in details. The power supply grid elements as selected in the power supply grid element selection process (step S31) are labeled a~h in FIG. 10(a).

Resistance values Rsupij of the power supply auxiliary wiring 30 are calculated respectively as: Rsupij of the power supply grid element a, b is 70; Rsupij of power supply grid element c is 40; Rsupij of the power supply grid element d, f 50; Rsupij of the power supply grid element e, g, h is 60. In this explanation, it is assumed that only a single power supply pad is used for the power supply grid elements selected by the power supply grid element clustering process (step S32) so that there is a single cluster.

In the power supply grid element pairing process (step S33), each adjacent two of the clustered power supply grid elements are paired, taking into consideration the respective supplementary resistance values of the power supply auxiliary wiring 30. In the power supply grid branch point calculation process (step S34), a branch point is located on a path connecting each pair of the clustered power supply grid elements, followed by obtaining the corresponding resistance value of the power supply auxiliary wiring, i.e., by the resistance value of the wiring connecting the paired power supply grid elements and the resistance value of the power supply auxiliary wiring 30 from the power supply pad 51 to the branch point (FIG. 10(b)).

In the following, the resistance value of the general wiring width is assumed to be 5 for each length of the power supply grid element (unit length). For example, since the supplementary resistance value of the power supply auxiliary wiring a, b is 70 respectively, the resistance value of the midpoint of the wiring connecting the power supply auxiliary wiring a, b is 60. In the case of the power supply, grid elements c, d, the length of the path as shown in the figure is 3 and therefore the resistance value between the power supply grid elements c, d becomes 15. When the branch point is located at the position c (the mid position of the power supply auxiliary grid element c), the resistance value of the power supply auxiliary wiring c becomes 35, while when the branch point is located at the position cd located nearer to the power supply pad 51, the resistance value becomes 37.6.

In this case, the latter position is selected because the flexibility becomes higher with a higher resistive value of the power supply grid element. Also, the branch points for the power supply auxiliary wirings e, f, g, h can be located similarly. With respect to all the branch point thus obtained, the power supply grid element pairing process (step S33) and the power supply grid branch point calculation process (step S34) are repeated until all the power supply grid elements of the cluster are connected (FIG. 10(b), (c), FIG. 11(a), step S35)

Figure 11A:
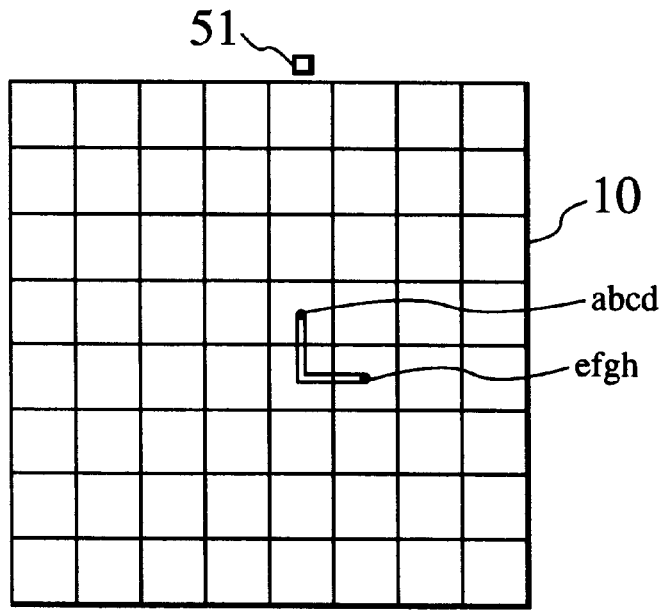
FIGS. 11(a), 11(b) are schematic diagrams for explaining the power supply auxiliary wiring layout determination process.
Figure 11B:
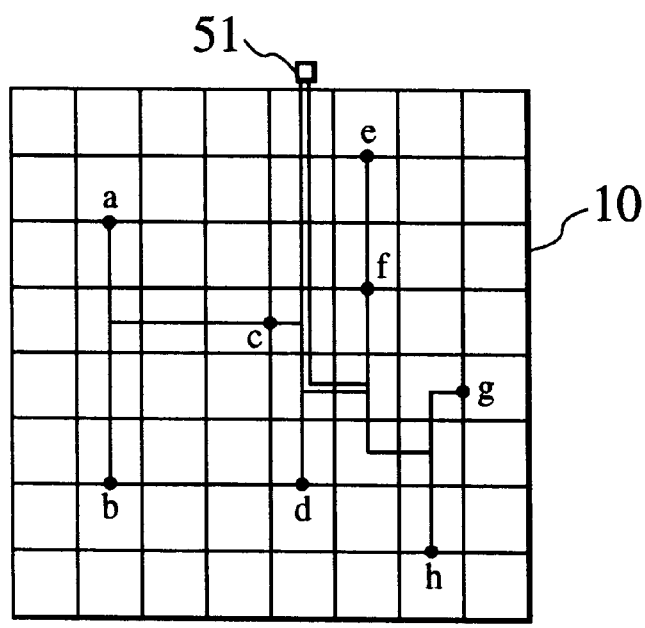

In FIG. 11(a), the resistance values of the power supply auxiliary wiring corresponding to the two points abcd and efgh are 37.5, 42.5, and the resistance value of the path connecting the two points abcd and efgh is 10. When the branch point is located at the position abcd, the resistance value becomes 32.5. If the wiring width or the line is doubled, the resistance value becomes 5 so that the resistance value of the power supply auxiliary wiring for points abcd becomes 37.6. Finally, the point abcd and the power supply pad 51 are connected with wiring having a doubled width in the power supply auxiliary pad connection process (Step S36) as shown in FIG. 11(b).

As explained above, in accordance with this embodiment, the wiring resources can be effectively used without oppressing the wiring resources to supply the necessary and sufficient power throughout the operatable circuit portions because the power supply auxiliary wiring is coupled to the power supply wiring in the form of a binary tree.

Next, a second embodiment in accordance with the design method of the power supply wiring of the present invention will be explained hereinbelow. In accordance with the design method of the power supply auxiliary wiring of the first above embodiment, the power supply auxiliary wiring in the form of a binary tree is appropriately designed from the voltage/electric current value of the power supply grid and the maximum allowable resistance value from the pad to the power supply grid, by giving the restriction condition of the resistance value to the power supply auxiliary wiring for electrically reinforcing the power supply wiring from the pad to the power supply grid element in parallel.

In this manner, in accordance with the first embodiment, the power supply auxiliary wiring is designed in the form of a binary tree by applying the restriction condition of the resistance value to the power supply auxiliary in bottom-up steps. However, from the view point that the design of the power supply auxiliary wiring is desirably more accurately determined, there is room for improvement.

This situation will be explained with reference to FIG. 12(*a*), (*b*), (*c*). The circuit as shown in FIG. 12(*a*) comprises resistances R1, R2 connected between the power supply voltage VDD and the ground, and constant electric current sources I1,I2 connected to the resistances R1, R2 respectively in series.

Here, it is assumed that the resistances R1, R2 are 2[Ω] respectively, and the electric current flowing to each of the electric current source 11,12 is 1 [A]. In the case that each of the voltage drops V1, V2 due to the resistances R1, R2 is to be under 1[V], in accordance with the method of the first embodiment, the resistances Rs1, Rs2 of 2[Ω] are inserted respectively in parallel to each of the resistances R1, R2 as shown in FIG. 12(*b*).

Figure 12A:
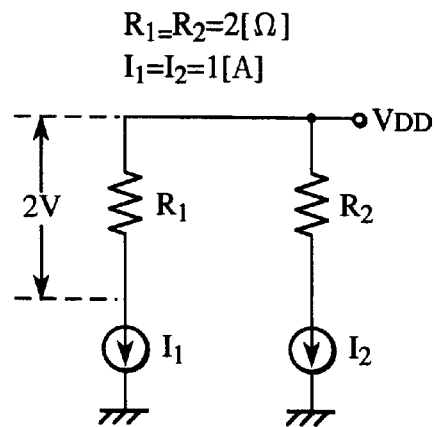
FIGS. 12(a), (b), (c) are equivalent circuit diagrams for explaining shortcomings of the first embodiment.
Figure 12B:
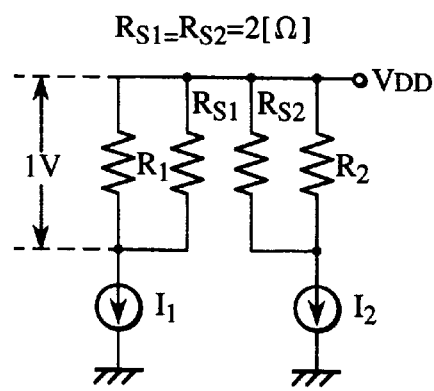
Figure 12C:
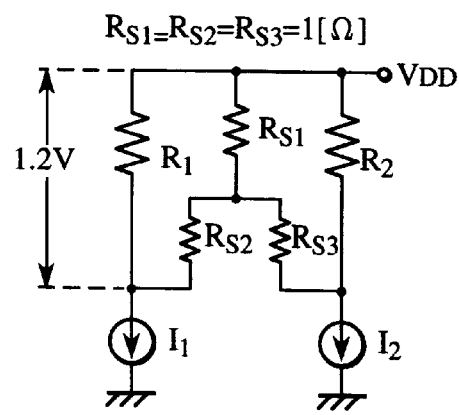

However, in the case that the parallel resistances Rs1, Rs2 and Rs3 (Rs1=Rs2=Rs3I1 (Ω) are designed in the form of a binary tree in order to satisfy the restriction condition of the resistance value as shown in FIG. 12(*c*), the electric current that flows to resistance Rs1 is 0.8 [A], the electric current that flows to each of the resistance Rs2, Rs3 is 0.4 [A] and the electric current that flows to each of the resistances R1, R2 is 0.6[A].

As a result, the above-mentioned voltage drops V1, V2 become respectively 1.2 M and exceed an allowable voltage drop (1[V]). This is because that the branch flow of the electric current into the power supply auxiliary wiring in the form of a binary tree is not considered. With this situation in mind, in the case of the second embodiment, a supplementary value of the electric current flowing to the power supply auxiliary wiring and the allowable voltage drop are treated as the restriction condition applied to the power supply auxiliary wiring in the form of a binary tree during the designing procedure rather than the restriction condition to the resistance value of the power supply auxiliary wiring.

Namely, the supplementary electric currents Isupij and the supplementary voltage drop Vsupij for the power supply grid element (i, j) are supplemented as the following equation (2) with the electric current value Iij that flows to the power supply grid element (i, j), the voltage drop dVij from the power supply pad to the power supply grid element (i, j) and the maximum allowable voltage drop Vmax from the power supply pad to the power supply grid elements.

$$(Isupij, Vsupi) = (Iij(1 - Vmax/dVij), Vmax) \quad (2)$$

Figure 13:
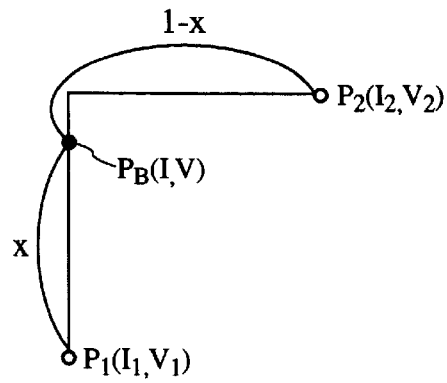
FIG. 13 is a schematic diagram for explaining the procedure of obtaining branch points in accordance with the second embodiment.

The balance point PB (I, V) is obtained by the following equation (3) from the voltage and electric current pairs P1 (I1, V1), P2 (I2, V2) (as shown in FIG. 13). In the equation (3), R12 is the resistance between the pair while x:(1−x) is the ratio of the resistance between P1 and PB and the resistance between P2 and PB.

$$(I,V) = (I1 + I2, (I1V2 + R12I1I1)/(I1 + I2)) \quad (3)$$

$$x = (V1 - V2 + R12I2)/R12(-I_1 + I_2) \quad (4)$$

Figure 14:
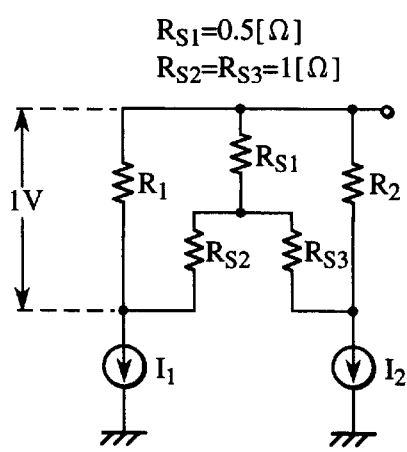
FIG. 14 is a schematic diagram for explaining the advantages of the designing method in accordance with the second embodiment.

In this way, the balance point is obtained in bottom-up steps to design an appropriate power supply auxiliary wiring in the form of a binary tree. In the above case, each voltage drop of V1 and V2 due to the resistances R1, R2 can be maintained under the allowable voltage drop 1 [V] by designing the power supply auxiliary wiring in order that the resistance Rs1=0.5 [Ω] and the resistances Rs2=Rs3=1 [Ω] as shown in FIG. 14. In the followings, the design method of the power supply wiring in accordance with the second embodiment will be explained in details. The design method of the power supply wiring of this embodiment comprises, with respect to the fundamental configuration, the grid form power supply wiring layout determination process (step S21) as shown in the flowchart of FIG. 6, the electric current consumption calculation process (step S22), the power supply wiring electric current/voltage calculation process (step S23) and the power supply auxiliary wiring layout determination process (step S24), like the first embodiment. However, the steps of the power supply auxiliary wiring layout determination process (step, S24) in this embodiment differ from those of the first embodiment.

Figure 15:
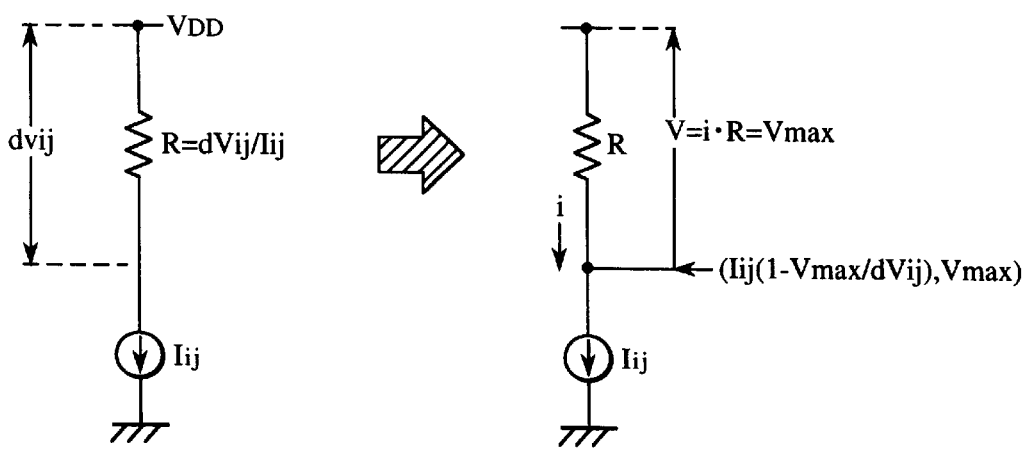
FIG. 15 is a schematic diagram for explaining the restriction conditions of the power supply auxiliary wiring in accordance with the second embodiment.

In accordance with the power supply auxiliary wiring layout determination process (step S24) of the second embodiment, the supplementary voltage drop and the supplementary current level of the power supply auxiliary wiring necessary for the respective power supply grid elements, i.e., two restriction conditions, are calculated on the basis of the equation (2) in order to design an appropriate power supply auxiliary wiring in the form of a binary tree which satisfies the two restriction conditions. When the power supply auxiliary line 30 having the supplementary electric currents Isupij and the supplementary voltage drop Vsupij is connected in parallel to the power supply wiring 10 from the power supply pad 20 to the power supply grid element (i, j), the voltage drop from power supply pad 20 to the power supply grid element (i, j) becomes equal be the maximum allowable value to satisfy the requirement as illustrated in FIG. 15.

Figure 9:
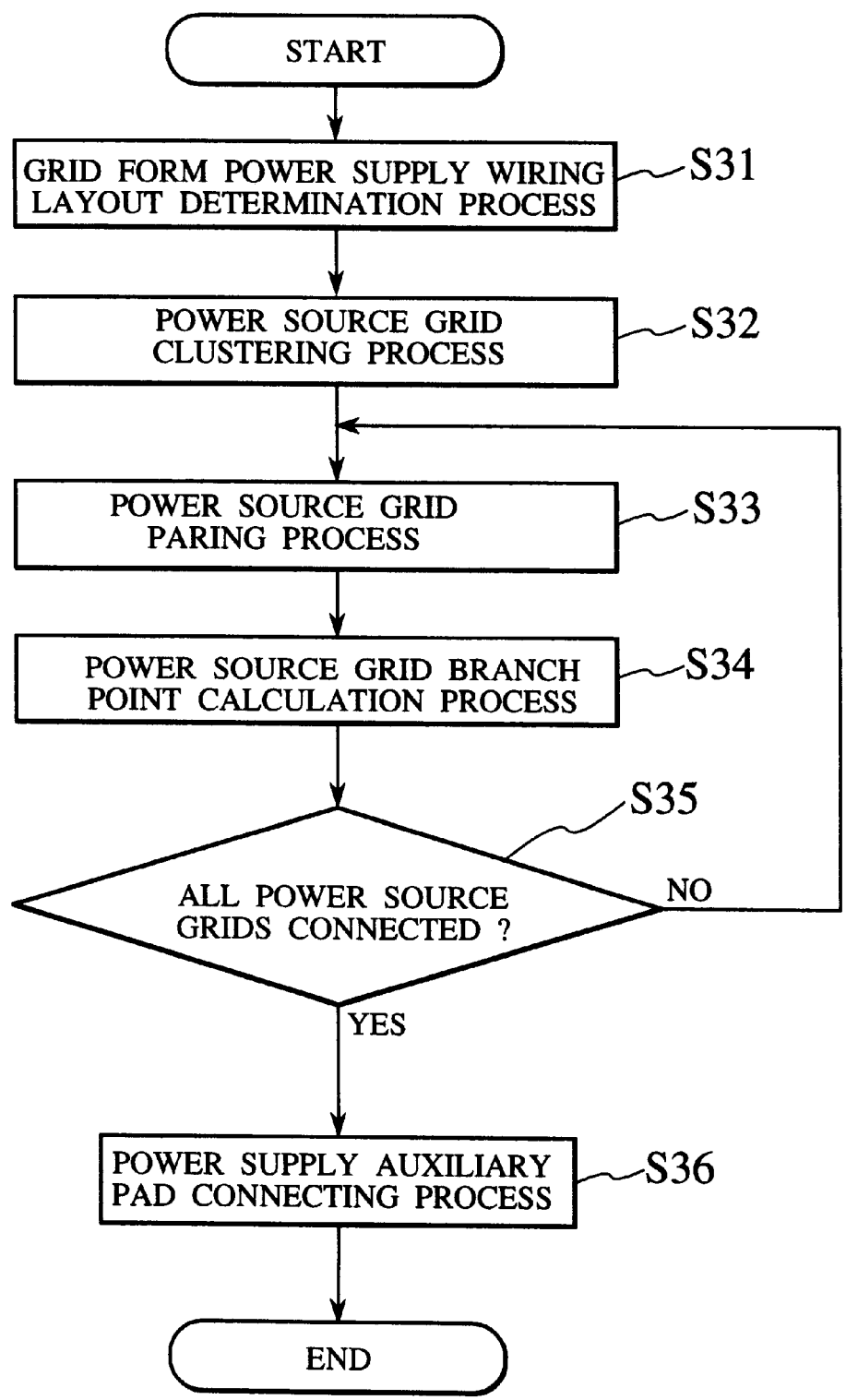
FIG. 9 is a flowchart of a power supply auxiliary wiring layout determination process shown in FIG. 6 in accordance with the first embodiment.

The power supply auxiliary wiring layout determination process of this embodiment comprises, with respect to the fundamental configuration, the grid form power supply wiring layout determination process (step S31), the power source grid clustering process (step S32), the power source grid paring process (step S33), the power source grid branch point calculation process (step S34) and the power supply auxiliary pad connecting process (step S36) as illustrated in FIG. 9.

In the power supply grid element selection process (step S31), a predetermined number of the power supply grid elements are selected which have larger supplementary electric current values than the rest among from the electric current values of the restriction condition as obtained.

In the power supply grid element clustering process (step S32), for each power supply auxiliary pad, those of the selected power supply grid elements as connected to said each power supply auxiliary pad through power supply auxiliary wiring are clustered respectively.

Namely, considering the distribution of the restriction conditions of the power supply auxiliary wiring 30, the power supply grid elements are clustered with respect f each power supply pad 51 by selecting from nearer ones to that pad in order.

In the power supply grid element pairing process (step S33), each adjacent two of the clustered power supply grid elements are paired, taking into consideration the respective restriction conditions and the respective position of power supply auxiliary wiring 30.

In the power supply grid branch point calculation process (step S34), a branch point (first level branch point) is located on a path connecting each pair of the clustered power supply grid elements in order that the above equation (2) is satisfied. After determining the locations of the first level branch points of all the pairs of the clustered power supply grid elements, the branch points are then treated as those corresponding to the power supply grid elements and paired in the same manner followed by locating a second level branch point located on a path connecting each pair of the first level branch points, in order that the above equation (2) is satisfied.

This procedure is repeated until each cluster of the power supply grid elements has a single branch point (step S35), which is finally connected to the corresponding power supply pad in a power supply auxiliary pad connection process (step S36), with wirings having such a width as to satisfy the two restriction conditions to complete the formation of the power supply auxiliary wiring 30 in a tree structure (binary tree).

Figure 16A:
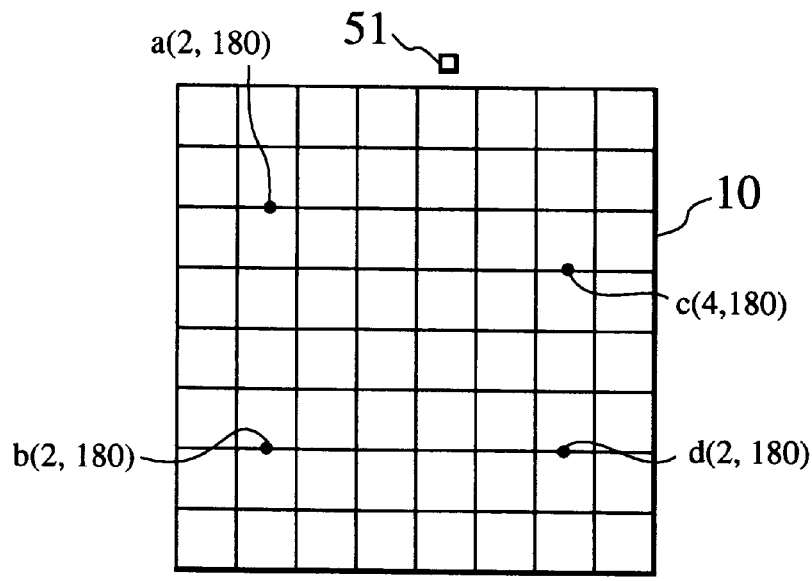
FIG. 16(a), (b) are schematic diagrams for explaining the power supply auxiliary wiring layout determination process in accordance with the second embodiment.
Figure 16B:
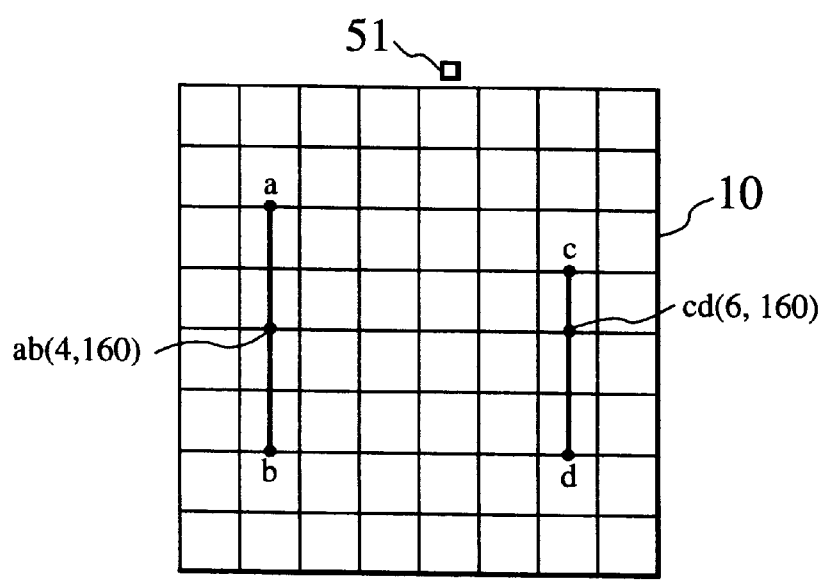

Next, with reference to FIG. 16 (*a*): (*b*) and also FIG. 17(*a*), (*b*), the above power supply auxiliary wiring layout determination process will be explained in details. Explanation is conducted in the case that the branch point PB on the path connecting the two power supply grid element P1, P2 and the voltage and electric current pairs (I, V) of the two restriction conditions thereof are obtained from the voltage and electric current pairs (I1, V1), (I2, V2) of the two restriction conditions of two power supply grid element P1, P2 ana the resistance value R12 of the path connecting the two power supply grid element P1, P2. As shown in FIG. 15, the following equation it obtained on the assumption that the restriction conditions of two power supply grid element P1, P2 is satisfied at the point by which the path connecting the two power supply grid element P1, P2 is divided into the ratio x:(1−x).

$$I = I1 + I2$$

$$(V1-V)/I1 = xR12$$

$$(V2-V)/I2 = (1-x)R12 \qquad (5)$$

The equation (3) and equation (4) are obtained, by solving this. When two restriction conditions are given to a pair of the clustered power supply grid elements (or two pared branch points), an appropriate next level branch point can be located on the path connecting the two power supply grid elements by making use of the equation (3) and equation (4). The power supply grid elements as selected in the power supply grid element selection process (step S31) are labeled and in FIG. 16(*a*). The two restriction conditions of the power supply auxiliary wiring are (2,180) relative to the power supply grid elements a, b, d and (4,180) relative to the power supply grid element c as shown in FIG. 16(*a*). Since this assumed that only one power supply pad is available for the power supply auxiliary wiring in the example shown in the same figure for the purpose of explanation, there is a single cluster as selected by the power supply grid element clustering process (step S32).

In the power supply grid element pairing process (step S33), each adjacent two of the clustered power supply grid elements are paired, taking into consideration the two restriction conditions of the power supply auxiliary wiring. In the power supply grid branch point calculation process (step S34), a branch point is located on a path connecting each pair of the clustered power supply grid elements in order to satisfy the two restriction conditions thereof as obtained on the basis of the above equation (3). In the following, the resistance value of the general wiring width is assumed to be 5 for each length of the power supply grid.

For example, since the two restriction conditions of the power supply auxiliary wiring relative to the two points a, b is (2,180) respectively and the resistance value of the line connecting the two points a, b is 4*5=20, the two restriction condition of the midpoint of the wiring connecting the power supply auxiliary wiring a, b is calculated as follows (FIG. 16(*b*)).

$$(2+2,(2*180+2*180-20*2*2)/4) = (4,160)$$

In the case of the two points c, d, the resistance value of the line connecting the two points c, d is 35=15, and the location of the branch point is determined at a position a third of the unit length apart from the point c using the equations (3), (4) so that the two restriction conditions is (6,160). With respect to all the branch points thus obtained, the power supply grid element pairing process (step S33) and the power supply grid branch point calculation process (step 834) are repeated until all the power supply grid elements of the cluster are connected (FIG. 16(*b*), FIG. 17(*a*), (*b*)).

Figure 17A:
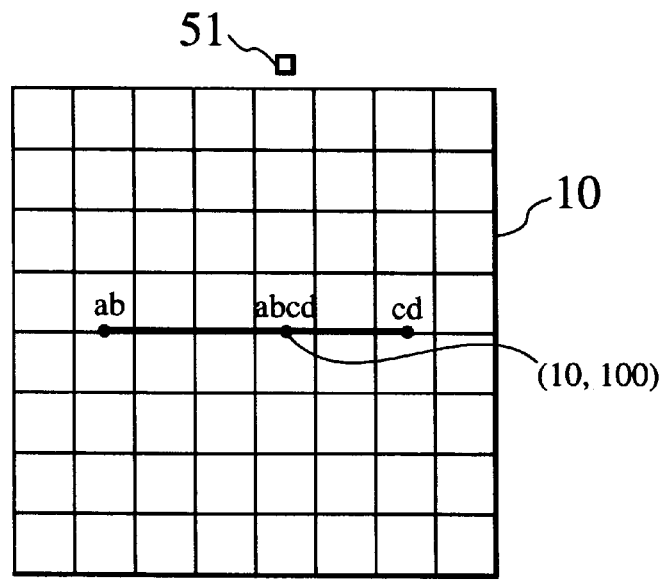
FIG. 17(a), (b) are schematic diagrams for explaining the power supply auxiliary wiring layout determination process in accordance with the second embodiment.
Figure 17B:
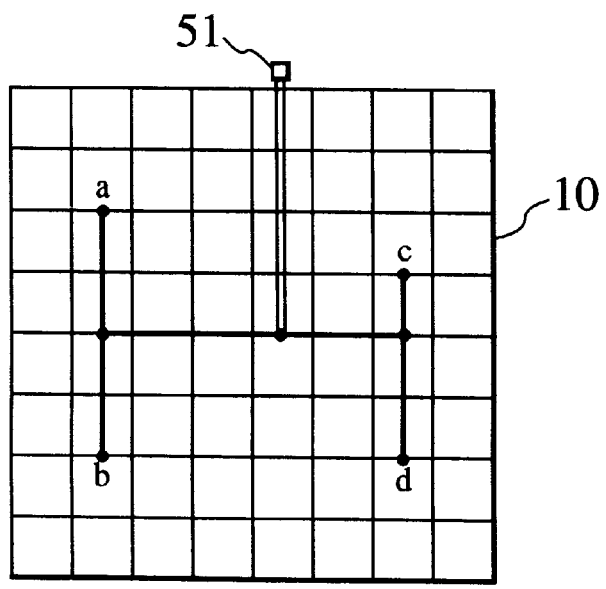

In the situation as shown in FIG. 17(*a*), while the two restriction conditions of the power supply auxiliary wiring is (10,100), the resistance value of the line connecting the power supply pad and the points abed is 20 so that the restriction conditions can not be satisfied. The width of the wiring is therefore doubled in order that the resistance value becomes 10 to satisfy the two restriction conditions. With this situation in mind, in the case of this embodiment, a supplementary value of the electric current value flowing to the power supply auxiliary wiring and the supplementary voltage drop are treated as the restriction conditions applied to the power supply auxiliary wiring in the form of a binary tree during the designing procedure rather than the restriction condition relative to the resistance value of the power supply auxiliary wiring, As explained above, in accordance with the semiconductor integrated circuit device of the present invention, the wiring resources have been effectively used without oppressing the wiring resources to the semiconductor chip supply the necessary and sufficient power throughout the operatable circuit portions because the power supply auxiliary wiring is coupled to the power supply wiring in the form of a binary tree, and therefore it is possible to obviate a wrong action originating from fluctuation of the power supply voltage due to voltage drop and deterioration of the performance.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated.

What is claimed is:

1. A method of designing power supply wiring on a semiconductor integrated circuit formed within a semiconductor chip, comprising:

a grid state power supply wiring layout determination step for determining the line width and the intervals of a grid state power supply wiring for supplying electric power to integrated circuits in accordance with an internal circuit placement of said integrated circuits;

an electric current consumption calculation step for calculating power consumption within each region of said integrated circuit as defined by said grid state power supply wiring;

an electric voltage/current calculation step for calculating an average voltage and an electric current of each side of a square formed by said grid state first power supply wiring in accordance with the calculation results of said electric current consumption calculation step; and a power supply auxiliary wiring layout determination step for obtaining restriction conditions of allowable minimum currents and allowable voltage drops applicable respectively to said sides and designing a power supply auxiliary wiring in the form of a binary tree which satisfies said restriction conditions in accordance with the calculation results of said electric voltage/current calculation step and connected to a power supply pad, to which said power supply wiring is not connected.

2. A method of designing power supply wiring for integrated circuits formed within a semiconductor chip, comprising:

a grid state power supply wiring layout determination step for determining the line width and the intervals of a grid state power supply wiring connected to a power supply pad for supplying electric power to said integrated circuits in accordance with an internal circuit placement of said integrated circuits;

an electric current consumption calculation step for calculating power consumption within each of a plurality of regions of said integrated circuit as defined by said grid state power supply wiring;

an electric voltage/current calculation step for calculating an average voltage at and an electric current passing through each grid elements on said grid state power supply wiring in accordance with the calculation results of said electric current consumption calculation step; and a power supply auxiliary wiring layout determination step for obtaining restriction conditions of resistance values of the power supply auxiliary wiring applicable respectively to said power supply grid elements of said grid state power supply wiring and designing a power supply auxiliary wiring in the form of a binary tree which satisfies said restriction conditions in accordance with the calculation results of said electric voltage/current calculation step and connected to a power supply auxiliary pad, to which said power supply wiring is not connected.

3. A computer program embodied on a computer-readable medium for designing power supply wiring for integrated circuits formed within a semiconductor chip comprising, said program comprising:

first means for setting a preset value of at least one manufacturing process factor with influence exerting upon a physical value of a substance as formed in said manufacturing apparatus; and second means for determining the line width and the intervals of a grid state power supply wiring connected to a power supply pad for supplying electric power to said integrated circuits in accordance with an internal circuit placement of said integrated circuits;

third means for calculating power consumption within each of a plurality of regions of said integrated circuit as defined by said grid state power supply wiring;

fourth means for calculating an average voltage at and an electric current passing through each grid elements on said grid state power supply wiring in accordance with the calculation results of said third means;

fifth means for obtaining restriction conditions of allowable minimum currents and allowable voltage drops applicable respectively to said sides and designing a power supply auxiliary wiring in the form of a binary tree which satisfies said restriction conditions in accordance with the calculation results of said fourth means and connected to a power supply auxiliary pad, to which said power supply wiring is not connected.

4. The method of designing power supply wiring as claimed in claim 1 wherein said restriction conditions of supplementary currents and supplementary voltage drops are obtained in accordance with the following equation in said power supply auxiliary wiring layout determination process, $$(Isupij, Vsupij) = (Iij(1 - Vmax/dVij), Vmax)$$

where Isupij and Vsupij are a supplementary electric currents and the supplementary voltage drop required at a power supply grid element (i, j) of said power supply auxiliary wiring corresponding to one of said sides, Iij is an electric current value flowing to the power supply grid element (i, j) required at the power supply grid element (i, j) of said power supply auxiliary wiring corresponding to one of said sides Vmax is a maximum allowable voltage drop from the power supply pad to the power supply grid elements, and dVij is a voltage drop from the power supply pad to the power supply grid element (i, j).

5. The method of designing power supply wiring as claimed in claim 4 wherein said power supply auxiliary wiring layout determination process comprises:

a power supply grid element selection process for selecting a predetermined number of the power supply grid elements having larger electric current values than the rest of said grid element among from the electric current values of the restriction condition;

a power supply grid element clustering process for clustering those of the selected power supply grid elements as selected by said power supply grid element selection process, respectively for each power supply auxiliary pad, considering the distribution of the two restriction conditions of the power supply auxiliary wiring and the location of said power supply pad;

a power supply grid element pairing process for paring the clustered power supply grid elements, taking into consideration the supplementary electric current value, the supplementary voltage drop and the location of the respective clustered power supply grid elements;

a power supply grid branch point calculation process for obtaining location of a branch point on a path connecting each pair of the clustered power supply grid elements in order that the equation is satisfied, and assigning two corresponding restriction conditions to each branch point;

a power supply auxiliary pad connection process for connecting a single branch point for each cluster to the corresponding power supply pad, with wirings hating such a width as to satisfy the restriction condition such that the supplementary current and the supplementary voltage drop are satisfied, in order to complete designing a power supply auxiliary wiring in the form of a binary tree.

6. The method of designing power supply wiring as claimed in claim 5 wherein the two restriction conditions (I, V) of the supplementary current and the supplementary voltage drop as used in said power supply grid branch point calculation process are obtained in accordance with the following equation $$(I,V)=(I1+I2, (I1V2+I2V1-R12I1I2)/(I1+I2)).$$

7. The method of designing power supply wiring as claimed in claim 2 wherein said restriction conditions to the supplementary resistances are obtained in accordance with the following equation in said power supply auxiliary wiring layout determination proceeds, $$Rsupij \leq Rij \cdot Rmaxij/(Rij-Rmaxij)$$

wherein Rsupij is the supplementary resistance value necessary for the power supply auxiliary wiring to the power supply grid element (i,j); Rij is the effective resistance value of the corresponding part of the grid form power supply wiring extending to the power supply grid element (i, j) from the power supply pad 20; Rmaxij is the maximum allowable resistance value from the power supply pad 20 to the power supply grid element (i, j).

8. The method of designing power supply wiring as claimed in claim 7 wherein said power supply auxiliary wiring layout determination process comprises:

a power supply grid element selection process for selecting a predetermined number of said power supply grid elements of said grid state power supply wiring having larger supplementary resistance value than the rest of said power supply grid elements among from the supplementary resistance values of the restriction condition;

a power supply grid element clustering process for clustering those of the selected power supply grid elements As selected by said power supply grid element selection process, respectively for each power supply auxiliary pad, considering the distribution of the restriction conditions of the resistance values of said power supply auxiliary wiring;

a power supply grid element pairing process for paring the clustered power supply grid elements, taking into consideration, the supplementary voltage drop and the location of the respective clustered power supply grid elements;

a power supply grid branch point calculation process for obtaining location of a branch point on a path connecting each pair of the clustered power supply grid elements in order that the equation is satisfied, and thereafter assigning a corresponding restriction condition to each branch point;

a power supply auxiliary pad connection process for connecting a single branch point for each cluster to the corresponding power supply pad, with wirings having such a width as to satisfy the restriction condition such that the supplementary voltage drop is satisfied, in order to complete designing a power supply auxiliary wiring in the form of a binary tree.

* * * * *